(12) United States Patent
Madge

(10) Patent No.: US 6,624,048 B1
(45) Date of Patent: Sep. 23, 2003

(54) DIE ATTACH BACK GRINDING

(75) Inventor: Robert Madge, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 55 days.

(21) Appl. No.: 10/005,097

(22) Filed: Dec. 5, 2001

(51) Int. Cl.[7] .............................................. H01L 21/46
(52) U.S. Cl. ...................... 438/460; 438/113; 438/459; 438/464; 414/935
(58) Field of Search ................................ 438/454, 455, 438/458, 460, 464, 977, 113, 114; 414/935–941

(56) References Cited

U.S. PATENT DOCUMENTS

| | | | |
|---|---|---|---|
| 5,155,068 A | * 10/1992 | Iada | 438/977 |
| 5,273,940 A | * 12/1993 | Sanders | 438/977 |
| 5,399,233 A | * 3/1995 | Murazumi et al. | 438/977 |
| 5,989,939 A | * 11/1999 | Fjelstad | 438/977 |
| 6,060,373 A | * 5/2000 | Saitoh | 438/459 |
| 6,162,701 A | * 12/2000 | Usami et al. | 438/455 |
| 6,294,439 B1 | * 9/2001 | Sasaki et al. | 438/464 |
| 6,420,209 B1 | * 7/2002 | Siniaguine | 438/108 |

* cited by examiner

Primary Examiner—Kevin M. Picardat
(74) Attorney, Agent, or Firm—Luedeka, Neely & Graham

(57) ABSTRACT

An apparatus for constructing a number of integrated circuits from a single substrate is provided by the present invention. A number of integrated circuits are constructed on the single substrate. The individual integrated circuits are then separated by cutting the substrate with a dicing saw. A vacuum chuck is used to grasp the individual integrated circuits while a back grinding process is performed on the individual circuits to polish the circuits to a predetermined thickness. The integrated circuits are then placed into integrated circuit packages. By performing the back grinding process after the substrate has been divided into the separate individual circuits, the present invention eliminates the need to back grind portions of the substrate that are not further used, and tends to eliminate handling of the fragile thinned substrate.

19 Claims, 2 Drawing Sheets

DIE ATTACH BACK GRINDING

FIELD

This invention relates to the field of integrated circuit fabricating. More particularly, this invention relates to back grinding individual integrated circuits after the integrated circuits are diced from the substrate on which they are fabricated.

BACKGROUND

Integrated circuits are typically fabricated on substrates containing a large number of individual integrated circuits. The fabrication process typically involves a number of processing steps such as deposition steps and etching steps to which the substrate is subjected to fabricate the integrated circuits. Each additional fabricating step used to process the substrate and construct the integrated circuits adds additional costs that increase the total cost of the finished integrated circuit. In addition, each fabricating step introduces the possibility of additional defects to the integrated circuit. These defects tend to decrease the yield of the fabrication process, and thus also increase the cost of the final integrated circuit. In today's highly competitive integrated circuit market, a seemingly small difference between the costs of two different integrated circuits can be the difference between a successful product and an unsuccessful product.

For example, the substrates on which the integrated circuits are formed are typically thinned prior to dicing and removal of the individual integrated circuits from the substrate. This process is generally referred to as substrate back side grinding. Unfortunately, as substrates become increasingly larger, and desired integrated circuit thicknesses become increasingly thinner, it becomes ever more difficult to control the back side grinding process. Further, the thinned substrates are much more delicate than the unthinned substrates, and thus tend to break more easily. Additionally, as some of the integrated circuits on the substrate do not function properly, not all of the integrated circuits need to be thinned.

Therefore, what is needed is a method that tends to streamline the fabrication process and produces an increased yield as compared to prior art fabricating processes.

SUMMARY

The above and other needs are met by a method for fabricating integrated circuits, where a plurality of individual integrated circuits are fabricated on a substrate. The substrate is partitioned into portions, and the partitioned portions of the substrate are individually back ground. In a most preferred embodiment, the partitioned portions of the substrate are individual integrated circuits.

Polishing or back grinding the individual integrated circuits after the substrate has been cut or diced as described in the above embodiment affords a number of advantages over the prior art. For example, polishing the individual circuits after they have been removed from the substrate ensures that only those portions of the substrate that will actually be used are polished. In additions by polishing the integrated circuits individually, the polishing process can be more accurately controlled to ensure that each individual integrated circuit has been polished appropriately. Polishing the individual integrated circuits after they have been cut from the substrate also minimizes the need to handle a relatively thin and delicate substrate during and after the polishing process, and thereby minimizes the likelihood that the substrate will be damaged.

In another embodiment there is provided an apparatus for processing integrated circuits having front sides and back sides. A picker engages the front side of one of the integrated circuits and removes the integrated circuit from a diced substrate. A grinder grinds the back side of the integrated circuit while it is held by the picker. A placer places the back ground integrated circuit in a desired location. For example, the picker may be a device such as an extendable shaft that engages the integrated circuit. The placer then translates the picker from station to station, such as from the location of the diced substrate, to the grinder location, and then to a package.

The above described apparatus provides many of the same advantages as the previously described method for fabricating integrated circuits. By polishing the integrated circuits after they have been separated from the substrate, the apparatus minimizes the need to handle the delicate substrate, and thus minimizes the likelihood that the substrate will be damaged. In addition, grinding each of the integrated circuits individually allows the grinding process to be more accurately controlled and custom tailored to each individual integrated circuit. The grinder is preferably incorporated into the processing apparatus, thereby eliminating the need to move the substrate to and from a remote location. Finally, only grinding the desired integrated circuits eliminates the need to polish portions of the substrate that will not actually be used. Further, if so desired, the different integrated circuits can be polished to varying degrees. Therefore, the embodiment of the present invention described above provides a number of benefits over the prior art.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
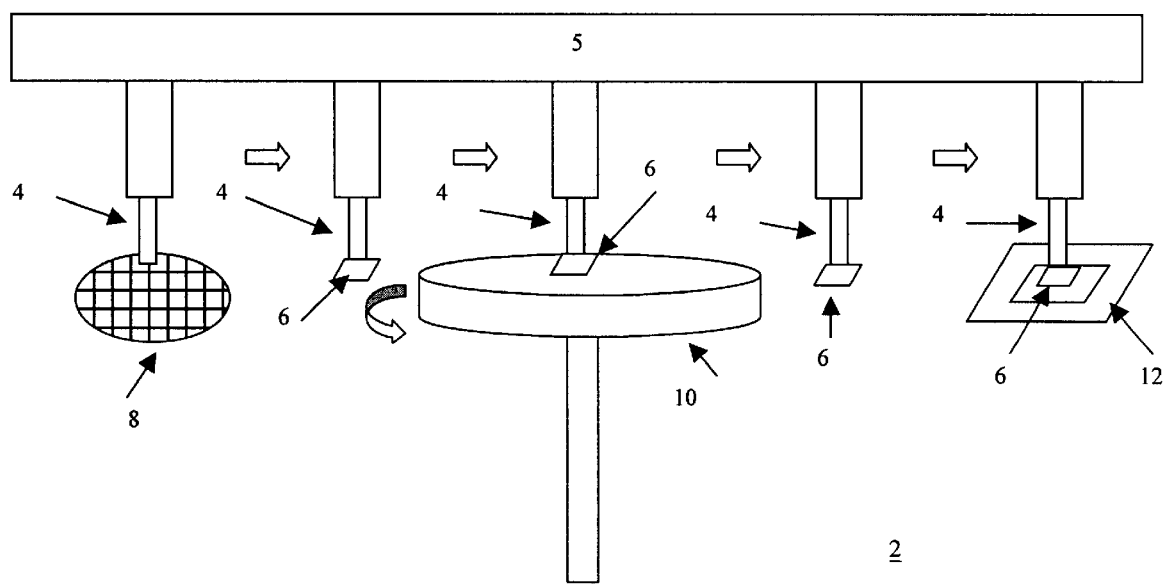
FIG. 1 is a functional diagram of an improved apparatus for fabricating integrated circuits constructed in accordance with a preferred embodiment of the present invention.

Referring now to FIG. 1, an apparatus 2 for fabricating integrated circuits 6 in accordance with a preferred embodiment of the present invention is shown. The apparatus 2 includes a picker 4 that engages and removes an integrated circuit 6 for processing by the apparatus 2. The picker 4 is preferably a vacuum chuck or similar functioning device that engages and removes the individual integrated circuits 6 from the substrate 8. However, it is appreciated by those skilled in the art that a variety of different types of devices may be used to engage and remove an integrated circuit 6 during such a process. The substrate 8 has preferably been diced into individual integrated circuits 6, such as with a saw, prior to removing the individual circuits 6 with the picker 4.

Once the picker 4 has removed an individual integrated circuit 6 from the diced substrate 8, the picker 4 with the engaged integrated circuit 6 is transported with a placer 5 to a grinder 10 such as a polishing wheel that is preferably incorporated into the apparatus 2. The picker 4 preferably holds the integrated circuit 6 against the grinder 10. The grinder 10 grinds the back of each individual integrated circuit 6 to a predetermined thickness. This grinding step may be referred to as back grinding or polishing of the integrated circuit 6. Once the integrated circuit 6 has been back ground by the grinder 10, the picker 4 and placer 5 are used to move the integrated circuit 6 to a circuit package 12 where it is preferably mounted.

Back grinding of the individual integrated circuits 6 after they have been diced and removed from the substrate 8 offers a number of advantages. First, back grinding the individual integrated circuits 6 as opposed to back grinding the entire substrate 8 prior to separating the individual integrated circuits 6 from the substrate 8 minimizes the need to handle a large, relatively thin, and delicate substrate 8, which tends to reduce substrate breakage. Furthermore, individually polishing the integrated circuits 6 allows for better process control, such that the thickness of the individual integrated circuits 6 can be more precisely controlled at the desired thickness. In addition, back grinding the individual integrated circuits 6 after they have been diced from the substrate 8 ensures that only the portions of the substrate 8 that are actually used are subjected to back grinding. Further, by individually back grinding each integrated circuit 6, the thickness of each of the integrated circuits 6 can be individually set. Incorporating back grinding equipment into the pick and place apparatus also eliminates the need to transport the substrate 8 to and from a remote location for processing by separate back grinding equipment. Thus, the embodiment of the present invention set forth in: FIG. 1 saves time and money.

Figure 2:
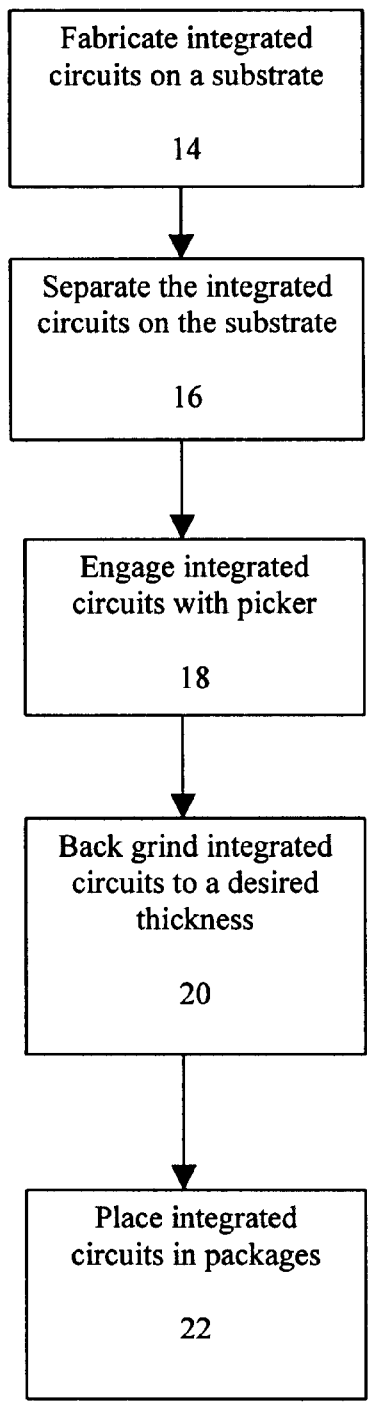
FIG. 2 is a flowchart of an improved method of fabricating an integrated circuit in accordance with another embodiment of the present invention.

Another embodiment of the present invention is directed toward a method for fabricating integrated circuits as set forth in FIG. 2. The method for producing the integrated circuits commences with the step of fabricating integrated circuits on a substrate as set forth in block 14. The integrated circuits are preferably fabricated using standard front end processes such as deposition and etching. Once the integrated circuits have been formed, the substrate is partitioned into the individual integrated circuits as shown in block 16. As previously discussed, the individual integrated circuits may be separated from the substrate such as by sawing. In block 18, an individual integrated circuit is engaged with a picker and removed from the partitioned substrate.

Once an individual integrated circuit is engaged with the picker, the method proceeds to block 20 wherein the engaged integrated circuit is transported to a grinding station with a placer, and back ground to a predetermined thickness. The predetermined thickness preferably depend upon the particular type of integrated circuit being fabricated. The back grinding of the integrated circuit is preferably accomplished with a polishing wheel. However, a wide variety of grinding methods are known in the art and various embodiments of the present invention incorporate these different grinding methods. The method ends by placing the thinned integrated circuit in an integrated circuit package as set forth in block 22. Placing the integrated circuit is preferably accomplished by transporting the integrated circuit with the pick and place apparatus.

The above discussed method of fabricating an integrated circuit in accordance with an embodiment of the present invention provides a number of benefits over the prior art. In particular, partitioning the substrate prior to performing back grinding minimizes the need to handle a relatively fragile thinned substrate. Furthermore, polishing the individual integrated circuit allows the polishing step to be customized and monitored for each integrated circuit. This allows for better process control and reduces the need to polish sections of the substrate that will not be used.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for processing integrated circuits, the method comprising sequential steps of:
   fabricating a plurality of individual integrated circuits on a substrate,
   partitioning the substrate into portions of integrated circuits,
   engaging and removing the portions, one from another, and
   individually back grinding the partitioned portions of the substrate prior to
   mounting an y of the integrated circuits within a portion.

2. The method of claim 1 wherein the portions comprise individual integrated circuits.

3. The method of claim 1 wherein the step of back grinding the partitioned portions further comprises removing the partitioned portions from the substrate prior to back grinding the partitioned portions.

4. The method of claim 1 wherein the step of partitioning the substrate into portions further comprises sawing the substrate into a number of unconnected sections wherein each section corresponds to an individual integrated circuit.

5. The method of claim 1 further comprising removing the portions from the partitioned substrate prior to back grinding the portions.

6. The method of claim 1 wherein the step of back grinding the portions further comprises back grinding the portions to a predetermined thickness.

7. The method of claim 1 wherein the step of back grinding the portions further comprises polishing the portions with a polishing wheel.

8. An apparatus for processing integrated circuits having front sides and back sides, the apparatus comprising:
   a picker for engaging the front side of one of the integrated circuits and removing the integrated circuit from a diced substrate,
   a grinder for grinding the back side of the integrated circuit while it is held by the picker, and
   a placer for placing the back ground integrated circuit in a desired location.

9. The apparatus of claim 8 wherein the placer is adapted to place the integrated circuit into an integrated circuit package.

10. The apparatus of claim 8 wherein the grinder further comprise a polishing wheel.

11. The apparatus of claim 8 wherein the picker further comprises a vacuum chuck for gripping the integrated circuit.

12. The apparatus of claim 8 further comprising a dicing saw that dices the substrate into the integrated circuits.

13. The apparatus of claim 8 further comprising back grinding measurement equipment for determining when the integrated circuit is back ground to a predetermined thickness.

14. A method of back grinding integrated circuits fabricated on a substrate, the method comprising sequential steps of:

fabricating integrated circuits on a substrate, dividing the substrate to separate the integrated circuits, individually back grinding each of the separated integrated circuits, and placing each of the separate integrated circuits into integrated circuit packages.

15. The method of claim 14 further comprising holding the separate integrated circuits with a vacuum chuck during the back grinding process.

16. The method of claim 14 wherein the step of back grinding comprises polishing the separated integrated circuits with a polishing wheel.

17. The method of claim 14 wherein the step of dividing the substrate to separate the integrated circuits further comprises dicing the substrate with a saw.

18. The method of claim 14 wherein the step of back grinding further comprises polishing the separated integrated circuits to a predetermined thickness.

19. The method of claim 14 further comprising the step of removing the separated integrated circuits from the substrate prior to performing the back grinding process.

\* \* \* \* \*